United States Patent
Kamgaing et al.

(10) Patent No.: US 10,498,379 B2
(45) Date of Patent: Dec. 3, 2019

(54) WIRELESS INTERCONNECTS ON FLEXIBLE CABLES BETWEEN COMPUTING PLATFORMS

(71) Applicant: Intel Corporation, Santa Clara, CA (US)

(72) Inventors: Telesphor Kamgaing, Chandler, AZ (US); Richard J. Dischler, Bolton, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/769,723

(22) PCT Filed: Dec. 8, 2015

(86) PCT No.: PCT/US2015/064511
§ 371 (c)(1),
(2) Date: Apr. 19, 2018

(87) PCT Pub. No.: WO2017/099730
PCT Pub. Date: Jun. 15, 2017

(65) Prior Publication Data
US 2018/0316375 A1    Nov. 1, 2018

(51) Int. Cl.
*H04B 1/18* (2006.01)
*G06F 1/16* (2006.01)
(Continued)

(52) U.S. Cl.
CPC ............... *H04B 1/18* (2013.01); *G06F 1/16* (2013.01); *H01L 23/3675* (2013.01);
(Continued)

(58) Field of Classification Search
CPC . H04B 1/18; H01L 23/49816; H01L 23/4985; H01L 25/16; H01L 23/3675;
(Continued)

(56) References Cited

U.S. PATENT DOCUMENTS 7,557,758 B2 *   7/2009   Rofougaran ........... H01Q 13/24
                                                         343/700 MS
2009/0180733 A1   7/2009   Hwang et al.
(Continued)

FOREIGN PATENT DOCUMENTS

WO    WO-2013040396    3/2013

OTHER PUBLICATIONS

International Search Report and Written Opinion for International Patent Application No. PCT/US2015/064511 dated Aug. 29, 2016, 18 pgs.

*Primary Examiner* — Thanh C Le
(74) *Attorney, Agent, or Firm* — Schwabe, Williamson & Wyatt P.C.

(57) ABSTRACT

Wireless interconnects are shown on flexible cables for communication between computing platforms. One example has an integrated circuit chip, a package substrate to carry the integrated circuit chip, the package substrate having conductive connectors to connect the integrated circuit chip to external components, a cable on the package substrate coupled to the integrated circuit chip at one end, a radio chip on the cable coupled to the cable at the other end, the radio chip to modulate data over a carrier and to transmit the modulated data, and a waveguide transition coupled to a dielectric waveguide to receive the transmitted modulated data from the radio and to couple it into the waveguide, the waveguide to carry the modulated data to an external component.

20 Claims, 7 Drawing Sheets

(51) Int. Cl.

| | | |
|---|---|---|
| *H01L 23/367* | (2006.01) | |
| *H01L 23/498* | (2006.01) | |
| *H01L 23/66* | (2006.01) | |
| *H01L 25/065* | (2006.01) | |
| *H01L 25/16* | (2006.01) | |
| *H01P 1/24* | (2006.01) | |
| *H01P 3/16* | (2006.01) | |
| *H01P 5/08* | (2006.01) | |
| *H05K 1/14* | (2006.01) | |
| *H05K 1/18* | (2006.01) | |
| *H05K 1/02* | (2006.01) | |
| *H01Q 1/36* | (2006.01) | |

(52) U.S. Cl.
CPC .... *H01L 23/4985* (2013.01); *H01L 23/49816* (2013.01); *H01L 23/49833* (2013.01); *H01L 23/66* (2013.01); *H01L 25/0657* (2013.01); *H01L 25/16* (2013.01); *H01P 1/24* (2013.01); *H01P 3/16* (2013.01); *H01P 5/087* (2013.01); *H05K 1/0274* (2013.01); *H05K 1/147* (2013.01); *H05K 1/181* (2013.01); *H01L 2223/6633* (2013.01); *H01L 2223/6677* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2225/06572* (2013.01); *H01L 2225/06586* (2013.01); *H01L 2924/15311* (2013.01); *H01L 2924/16152* (2013.01); *H01Q 1/36* (2013.01); *H05K 2201/045* (2013.01); *H05K 2201/046* (2013.01); *H05K 2201/1053* (2013.01); *H05K 2201/10098* (2013.01); *H05K 2201/10515* (2013.01); *H05K 2201/10522* (2013.01)

(58) Field of Classification Search
CPC ........... H01L 23/49833; H01L 25/0657; H01L 23/66; H01P 5/087; H01P 3/16; H01P 1/24; H05K 1/181; H05K 1/147; H01Q 1/36

See application file for complete search history.

(56) References Cited

U.S. PATENT DOCUMENTS

| | | |
|---|---|---|
| 2009/0207090 A1* | 8/2009 | Pettus ..................... H01L 23/66 343/873 |
| 2012/0050125 A1 | 3/2012 | Leiba et al. |
| 2014/0106582 A1 | 4/2014 | Wig et al. |
| 2014/0287703 A1 | 9/2014 | Herbsommer et al. |

* cited by examiner

WIRELESS INTERCONNECTS ON FLEXIBLE CABLES BETWEEN COMPUTING PLATFORMS

CROSS-REFERENCE TO RELATED APPLICATION

This patent application is a U.S. National Phase Application under 35 U.S.C. § 371 of International Application No. PCT/US2015/064511, filed Dec. 8, 2015, entitled "WIRELESS INTERCONNECTS ON FLEXIBLE CABLES BETWEEN COMPUTING PLATFORMS," which designates the United States of America, the entire disclosure of which is hereby incorporated by reference in its entirety and for all purposes.

FIELD

The present disclosure relates to communication between devices in a computing system and, in particular, to radio communication through waveguides and a flexible cable interface.

BACKGROUND

In many computer systems multiple integrated circuit chips communicate with each other to perform the programmed operations. The different chips may include central processing units, high speed memories, mass storage devices, chipsets, video processors, and input/output interfaces. Some computers may have more than one of each of these kinds of chips. The chips are traditionally mounted to a motherboard or system board either directly or through a socket or a daughter card.

The chips traditionally communicate using copper interconnects or links that travel through the chip's package vias, through the socket, through the platform motherboard and then back through the socket (or other interconnect) and package of the next chip. In another variation, a flexible connector cable is connected directly between two different packages to bypass the socket and the platform motherboard. This provides a more direct path with fewer interfaces through different connections.

For high performance computing and server platforms the speed of communication between the chip packages and other peripheral or parallel computing systems may limit the overall system performance. The socket, traditionally used to connect chips to a motherboard or system board, has a limited data rate due to the many interfaces for a signal to travel from one chip to the next through a package, the socket, the system board and up through another socket to the other chip. For servers connected through a server backplane, a signal may travel from one chip to another server through a package, the socket, the system board and then to a server backplane or through the motherboard to the backplane. There are additional signal interfaces to connect from the server backplane to the signal's destination. These data signal lines also require physical space in the socket and in the system board.

Flex cables or optical fibers with multiple parallel conductors are used to conduct data signals over short distances between CPUs in the same or another enclosure and between racks in a rack system. Cables and fiber are also used to conduct signals between a CPU and another component. The flex cable is attached directly to the chip packages after the chips are socketed in the system board. The package substrate has a cable connector on one or more edges and a cable is attached to each connector. The cable connects two different chip packages together or to a server backplane. This avoids routing the signal through the socket. For longer distances, optical interconnects can be used. In the same way, the package is first socketed to the system board. The package includes an optical fiber connector on the edge of the package substrate and the optical fibers are connected directly to the package substrate.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Inexpensive, high frequency, millimeter-wave circuitry can be used to communicate high bandwidth data among silicon data processing devices. The communication may be wireless through free space or through dielectric waveguides. This avoids the bulk, cost, and precision alignment of electrical cables and fiber optics, assemblies. Obstructions from heat sinks or other objects can impede wireless signal propagation. In some systems, line-of-sight paths are not available. There may also be significant attenuation over distances through free space paths.

The systems described herein are less susceptible to platform obstructions such as heat sinks, mounting hardware, and fans. The systems may also be combined with other known signal transport mechanisms such as dielectric waveguides to enable medium distance, such as within a component rack, signal transmission.

As described herein a flexible cable may be used to escape through obstructions that might otherwise block wireless high speed signals. A wireless interconnect is attached to the end of the flexible cable to couple the signals into a low loss dielectric waveguide bundle. To further reduce bulk and alignment costs, the wireless interconnect module may be mounted or partially integrated into the flexible electrical cable.

The systems described herein have all the benefits of wireless interconnects generally, but by using millimeter wave radio frequencies, the signals can be beam steered or reflected as desired. Flexible dielectric cables allow designers to adjust the orientation of the interconnect independent of transmission beam factors. A waveguide to antenna coupling is very forgiving. Whereas optical fibers and photonics require expensive precise micron-scale alignment, a flex cable may be used as a very inexpensive extension to bring signals outside of a platform chassis or case for inter and intra-rack applications.

Figure 1:
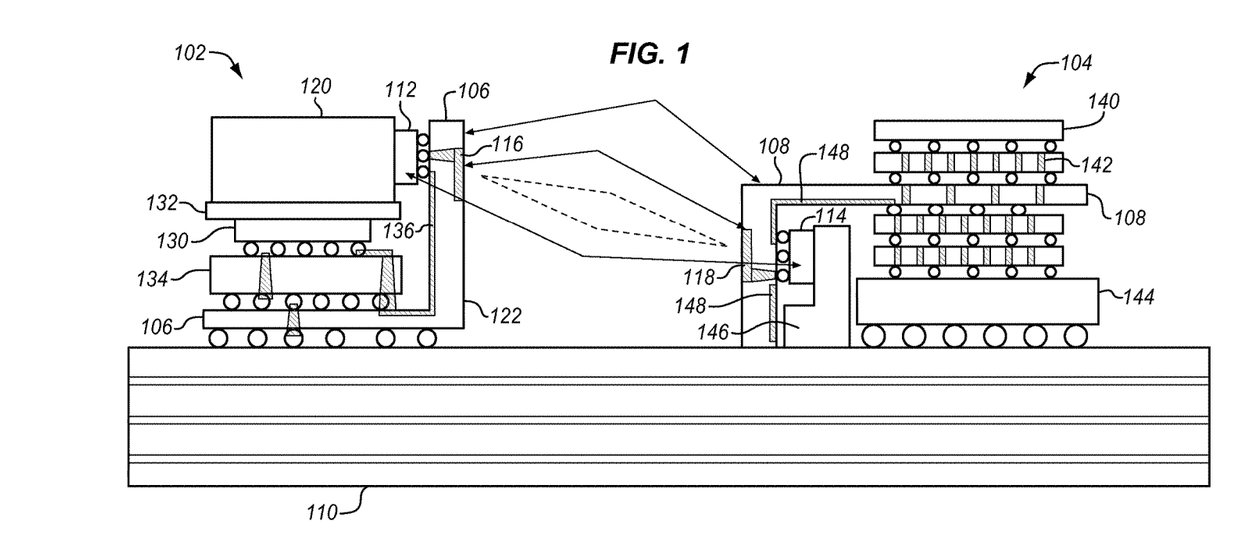
FIG. 1 is a side view cross-sectional diagram of a wireless interconnect for chip-to-chip communications according to an embodiment.

The systems described herein may be adapted to a variety of different systems including server platforms with diving board packages and multiple Gbps data links. Using an antenna matrix the wireless connections are scalable and allow for multi Gbps data transfer using multiple links with or without dielectric waveguides FIG. 1 is a general side view cross-sectional diagram of one example of a wireless interconnect using antennas for chip to chip communication or package-to-package communication. A first 102 and second 104 integrated circuit (IC) chip package are each mounted to a printed circuit board (PCB) 110, such as a motherboard, system or logic board or daughter card using a solder ball array or any other desired system. The packages 102, 104 are electrically connected to external components, power, and any other desired devices through traces (not shown) on or in the PCB. The chips may also be connected to each other through the PCB. The packages may be mounted to the PCB using sockets (not shown), depending on the particular implementation.

The first and second chip packages are discussed herein as being central processing unit packages and, in particular, as server CPU packages. However, the techniques and configurations described herein may be applied to many different types of chips for which a high speed communications link would be suitable. In some implementations, the chip may include many different functions such as with a SoC (System on a Chip). In addition each package may contain many different chips, such as in a multi-chip package or SiP (System in a Package). In other implementations, the chips may be memory, a communications interface hub, a storage device, co-processor or any other desired type of chip. In addition, the two chip packages may be different so that one may be a CPU and the other may be a memory or a chipset, for example.

Each package 102, 104 is also connected through a flexible connector 106, 108 to a respective radio 112, 114. The flexible connector may be any of a variety of different types of connectors. One type of connector is a flat flexible connector with a series of flat or round copper or coated copper conductors extending from one end of the connector to the other. The conductors may be insulated with polyester, polyimide, or another polymer, which also forms the body of the cable. The flat copper conductors can easily be accessed by piercing through the insulation as is done by many different types of cable connectors. The conductors may be shielded with another grounded conductive layer or with coaxial configurations to reduce crosstalk between the long parallels conductors.

The radio may be formed of a single die or a package with multiple dies or using another technique. Each radio is mounted to the flexible connector near the edge of the package within a line of sight path to the other package. Each package may include copper traces, lines, or layers to connect particular lands, pads, or solder balls of the chip to the flexible connector for data and control signals. The radio die may also be connected directly to the flexible connector to receive power and other signals from the package. Alternatively, the radio die may obtain power from an external source through the package connection to the PCB.

An antenna or antenna array 116, 118 is also mounted to the flexible connector and coupled to the radio through the flexible connector. In this example, the antennas are attached to an opposite side of the flexible connector from the radio die, however, the radio dies may also be mounted on the same side of the flexible connector. Using steerable arrays, the antennas may be steered to establish a link between the two packages, with other nearby packages, and to switch from one package to another. The short distance between the antennas allows for a low power and low noise connection between the two chips. The wireless interconnect reduces the complexity of the socket and the complexity of the motherboard for the computing platform.

The first package 102 on the left side of the diagram represents a SoC chip or chip stack that is covered by a heat sink 120. The chip stack includes a single integrated circuit die 130 covered by a heat spreader 132 to draw heat from the die to the heat sink 120. The die is assembled on a package substrate 134 which is mounted to the flexible connector 106. The flexible connector is long enough to extend beyond the heat spreader, under the heat sink, and beyond the heat sink. The package substrate is mounted to the flex cable with a solder ball or land or pad array and the flex cable is mounted to the motherboard 110 with another solder ball or land or pad array. The flex cable has metal lines or vias to connect the connection on the package substrate to the motherboard through the flex cable. The structure may be reversed so that the flex cable is directly attached to the die between the die and the package substrate. The package substrate is then attached to the motherboard as on many other structures.

The mm-wave interconnect includes the transceiver or radio die 112 that is attached to the back side of the flexible cable 106 and the antenna 116 that is integrated into the flexible cable. For illustration, the flexible electrical cable is bent by 90 degrees at an elbow 122 to achieve a better signal propagation between the antennas 116, 118 of the two packages. The change from horizontal to vertical may be sharp as shown or gradually curved. The die has a path for data signals from the die through the package substrate to the flex cable. A trace or wire layer 136 on or in the flex cable connects the die to the radio die 112. This signal may then also be encoded, modulated, upconverted, and coupled to the antenna 116. The flex cable also carries transmit power and processing power to the radio die and antenna. This may be supplied from the motherboard or from the die, depending on the particular implementation.

The flexible cable may be secured in position in a variety of different ways. In some embodiments, a mechanical clamp (not shown) is attached to the heat sink and used to maintain the flexible connector in the desired orientation. In the illustrated example the cable 106 for the left side package 102 is held against an exterior vertical wall of the heat sink 120. This allows the antenna to be mounted to the cable and directed horizontally toward other packages. The dies, substrate, cable, antenna, and heat sink may be assembled as a single package prior to installation on the system board. This eliminates any requirement to attach cables or other structures to the package as may be required for optic fiber or wired connections.

The receiving package 104 may be a single die, or multiple dies 140, including the die stack on multiple assembled packages (as shown) such as a PoP (Package on Package) assembly. In this case four dies are stacked on top of each other and connected through the middle dies using through silicon vias 142. The bottom die is coupled to a package substrate 144 which connects the dies to the motherboard. The dies may be connected using intermediate transposers or interposers or substrates.

The flexible cable 108 may be attached to any one of the stacked dies 140 at the top, bottom or middle of the stack. In the illustrated example, the flex cable is attached between two dies. This allows for two of the dies to connect directly to the cable. The other dies may connect through the other dies in the stack. The connections may be made by land grid, ball grid, solder ball or some other type of array. The flex cable is attached to dies at one end and to a mechanical fixture 146 on the other end. The mechanical fixture may be mounted directly to a system board as shown to achieve the desired orientation and signal transmission rate or it may be mounted on a substrate of the die stack assembly or any other desired structure including a heat sink. In this example then end of the flex cable extends past the radio die and antenna to the motherboard 110. The cable may be attached to the motherboard so that a trace 148 on the cable from the motherboard to the radio die may be used to supply power, grounding, control signals, or even additional data for transmission.

The flex cable has wiring layers or traces 148 to connect the dies to the radio die 114. The radio die is attached to the cable on one side and an antenna is attached to the other side. As described below, there may be many more than one radio attached to the cable. The flex cable is attached to the mounting fixture through the radio die. More specifically, the radio die is attached to the cable on one side and to the fixture on the other side. The radio die provides a hard surface that lends itself to attachment, however, any other attachment may be used, depending on the particular implementation.

While different frequencies may be used to suit particular implementations, millimeter wave and sub-THz frequencies allow for an antenna that is small enough to be integrated on the same package that is normally used for the chip. The antennas may also be constructed using the same materials that are used in the fabrication of the package substrate and still exhibit good electrical performance.

In some embodiments, a server may be constructed with multiple CPUs. Each CPU may be mounted to a package with multiple parallel radio die and antenna sets to provide multiple parallel channels within the server between the two CPUs. A small antenna size permitted for mm-wave signals allows each antenna of the package for one of the CPUs to be directed to a corresponding antenna on the package for the other CPU. This configuration may be used to combine parallel radio connections and provide Terabit per second (Tbps) data rates.

In some embodiments, a broadband wireless interconnect may be used. For example, with a radio operating in a radio frequency range of from 100-140 GHz, the size of each antenna including the keep out zone can be as small as 1.25×1.25 mm to 2.5×2.5 mm. The actual antenna may be still smaller. Considering a flexible cable width, multiple radio dies may be placed across the surface of a single cable. This allows room for multiple parallel and separate links each carrying 40-80 Gb/s each over a short distance. The data rate per link may further be increased by using advanced modulation schemes. The separate links may all be used to communicate with a single second package as shown in FIG. 1 or there may be different package antennas placed next to different antennas of the package. This allows the package to communicate with different chips using different links.

In addition to the simple point-to-point connection of FIG. 1, point-to-multi-point transmission may also be provided without using an external switch matrix. The antennas of multiple chip packages may be positioned within range of the antenna or antennas of one of the CPU packages. The multiple chip packages may all receive the same signal from the CPU package at the same time. In order to control which of the multiple chip package receive a transmission, the radio and antenna system may include beam steering.

Figure 2:
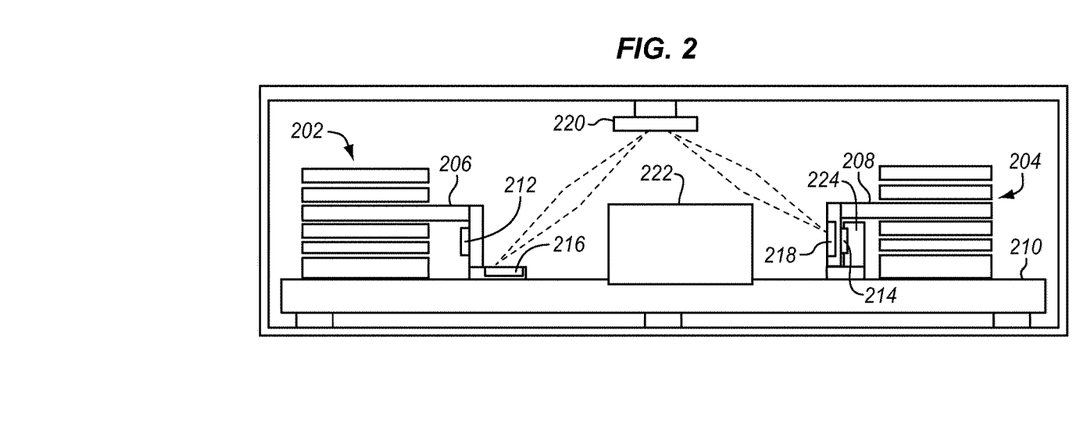
FIG. 2 is a side view cross-sectional diagram of an alternative wireless interconnect for chip-to-chip communications according to an embodiment.

FIG. 2 is a side view cross-sectional diagram of an alternative configuration of a wireless interconnect. In this embodiment wireless interconnect on flex is used in combination with reflectors to enable non line of sight (NLOS) signal transmission. As shown a first 202 and a second 204 package are each mounted to a motherboard 210. Each package includes a flex cable 206, 208 that is coupled to one or more dies of the die stack package at one end and that is connected to a respective radio die 212, 214 at the other end. Each radio die 212, 214 is connected to a respective antenna 216, 218. The antennas are positioned to provide a clear and direct wireless connection to a reflector 220. The die stack packages and the system board are all enclosed within a chassis or housing that contains other components 222. In some cases, the other components come between the antennas. The reflector is mounted to a wall of the inside of the chassis, although it may be mounted to another structure, so that it reflects signals from one antenna package to the other.

As shown the flex cable and antenna mounting may take any of a variety of different forms. On the left side of the diagram, the flex cable bends to lie flat against the system board. The cable may be held by a clamp, fixture, adhesive, or other structure. With one side of the cable flush against the system board, the other side of the cable is facing up and away from the system board. The antenna is mounted to the upward facing side which allows the antenna to connect through the reflector. The antenna may be directed to the reflector or have a beam wide enough to reach the reflector and some other structures, including another reflector (not shown). The radio die 212 is not opposite the antenna on the cable because the cable is against the system board, although the radio die may be mounted to the system board and the cable attached over it. In this example, the radio die is on the opposite side of the cable but spaced away from the antenna to a part of the cable where there is room for the radio die. The radio die and the antenna are connected through the cable.

On the right side of the diagram, a fixture 224 is attached to the system board near the die stack package. A similar structure is shown in FIG. 1. The fixture holds the cable in place so that the radio die on one side of the cable is protected and the antenna on the other side of the cable is aimed in a proper direction. The cable attachment fixture secures the cable in position and control the direction of the antenna. While the structure on the right side of FIGS. 1 and 2 appear to be similar, the propagation of the radio waves appears to be different. In the case of FIG. 1, the radio signal propagates horizontally, while in FIG. 2, the radio signals propagate vertically. This may be because the antennas differ and direct the signals in different directions. It may also be because both antennas generate a very wide beam that covers both directions at the same time and only the direction of interest is shown in the diagram.

In some embodiment, the antennas may also be arranged in a steerable array configuration. A beam steering algorithm may be applied to the radio signals at the antenna array to define a steering angle. The beam main lobe may then be pointing in a direction that is not perpendicular to the surface of the antenna. This allows for simpler antenna placement and it allows the data to be sent to different external components in different locations using a single radio and antenna.

The packaged system may take any of a variety of different forms. One or both of the packages may be a microelectronic module that contains a system on a chip (SoC) or CPU package 202, 204. The flex cable carries a millimeter-wave or sub-THz transceiver chip (radio) 212, 214 and an integrated antenna 216, 218. Additional dies and other supporting components such as passives and connectors may also be assembled on the package substrate 206, 208. A SoC die is typically designed and implemented on a low resistivity digital silicon and may also include typical functions found in the baseband portion of a wireless module. If the transceiver or radio die is implemented as a separate die, as shown, then it may be implemented in a high resistivity silicon or on any other type of RF (Radio Frequency) semiconductor substrate including Gallium Arsenide, Gallium Nitride and certain polymers.

The wireless interconnect system includes the transceiver chip 212, 214 the on-cable antenna 216, 218 and the flex cable 206, 208 to connect the transceiver chip to the main chip and to the antenna. The wireless transmission also uses a wireless receiver on the other package. The receiver system may be a mirror image of the transmitter. For bidirectional transmission, the mm-wave/sub-THz transceiver may have both transmit and receive chains.

Figure 3:
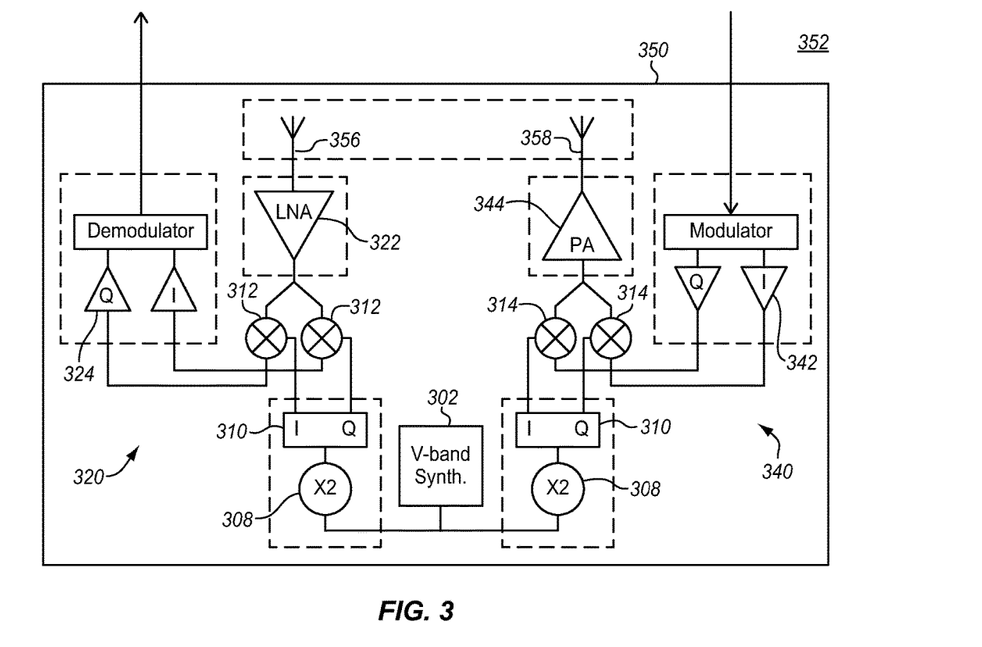
FIG. 3 is a block diagram of a radio chip and related components according to an embodiment.

FIG. 3 is a block diagram of an example of a transceiver or radio chip system architecture and connected components that may be used for the wireless interconnect described herein. The transceiver chip may take a variety of other forms and may include additional functions, depending on the particular implementation. This radio design is provided only as an example. The radio chip 350 is mounted to the package substrate 352 to which the primary integrated circuit die or chip 202, 203 is also mounted as shown in FIG. 1. The substrate 352 is mounted to the PCB or motherboard. The radio package may include a local oscillator (LO) 302 or a connection to an external LO and optionally a switch that allows the external LO feed to be used instead of or in addition to the internal LO. The LO signal may pass an amplifier and multiplier, such as an active doubler 308 and 0/90° quadrature hybrids 310 to drive an upconverter and mixers 314.

The RX (receive) chain 320 may contain a receive antenna 356 in the package coupled to a low noise amplifier (LNA) 322 and a wideband baseband (BB) amplification chain 324 with downconverters 312 for analog to digital conversion. The TX (transmit) chain 340 may include a BB digital driver chain 342 to the upconverters 314, and a power amplifier (PA) 344 to the transmit antenna 358. There may be multiple transmit and receive chains to transmit and receive over multiple channels simultaneously. The various channels may be combined or consolidated in different ways, depending on the particular implementation.

The TX and RX chains are both coupled through the substrate to the antenna. There may be a single antenna for TX and RX or there may be separate RX and TX antennas as shown. The antennas may be designed to have different radiation patterns to suit different wireless connections. In some embodiments, a first chip's antenna may have a wide beam transmit and receive pattern. This may allow the chip to communicate with multiple antennas in different locations on the motherboard. A second chip's antenna, on the other hand, may have a narrow beam transmit and receive pattern. This allows power to be concentrated in a single direction for communication with just one other device.

Figure 4:
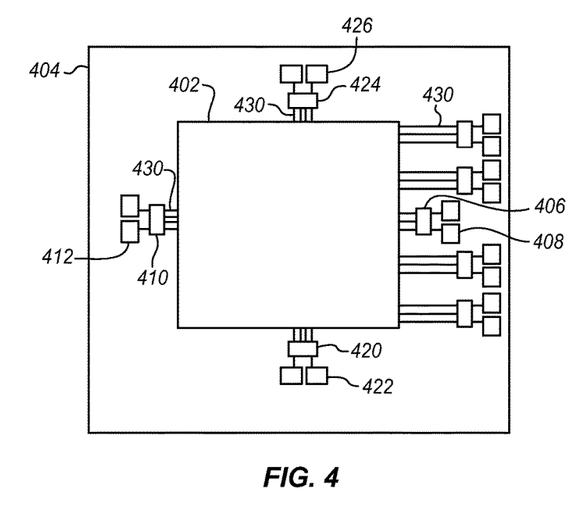
FIG. 4 is a top view diagram of a package with multiple wireless interconnects for chip-to-chip communications according to an embodiment.

FIG. 4 is a top view diagram of an example of an implementation of multiple wireless interconnects on a single microserver package. In this example, separate antennas are used to transmit and receive, but it is also possible to share the antenna between the Tx and the Rx chains. The antenna size may vary from 1.25×1.25 mm or less to 2.5×2.5 mm or more depending on the carrier frequency, desired gain, and transmission range. The data rate may be further increased through the modulation scheme or an increase in the frequency bandwidth.

A single integrated circuit chip or die 402 includes both processing and baseband systems and is mounted to a package 404. The baseband sections of the chip are coupled through on package traces 430 to radio chips or dies which are in turn coupled through the package to antennas. In this example, the die integrated circuit chip is a CPU for a server and is rectangular. There are radio chips on each of the four sides of the CPU. The sides shown as top, left, and bottom in the drawing figure each have a respective radio 424, 410, 420 coupled to a respective Tx, Rx antenna pair 426, 412, 422. The side shown as the right side shows five radios each connected to a respective antenna pair. The number of radios and antennas on each side may be determined based on communication rate needs in each direction.

Very few high speed links may be required on a server package. A single link is able to deliver data rates in excess of 40 Gb/s across a distance of a few cm. The data rate may still be on the order of 5-10 Gb/s for transmission distances of up to 50-100 cm.

FIG. 4 shows many wireless links implemented on the same side of one package. This allows the aggregate data rate to be increased. Alternatively, the data may be sent to different other devices that are in the same general direction. Both the radio chips and the antennas are placed towards the edge of the package to limit obstructions in the radio path that may come from heat sinks and heat spreaders. In general the losses for a copper trace baseband signal are much lower than the losses through the same copper trace for an RF signal. As a result, the radio chips may be kept very close to the antenna. This limits electrical signal and power losses due to the RF routing through the substrate. The radio chip may be installed onto the package in any manner desired and may even be embedded in or a part of the substrate. By using multiple radios, the on-package mm-wave wireless interconnects can be scaled for extremely high data rate applications. This may be useful in systems such as servers and media recording, processing, and editing systems. As shown, multiple links can be put together to achieve data-rates close to a Tb/s.

While FIG. 4 shows independent radios and antennas attached to a package substrate, the same principles may be applied to flexible cables. Flexible cables may be attached to the package substrate on one or more sides and extend in different directions for a short distance from the package as shown in FIGS. 1 and 2. Radios and antennas in the numbers shown in FIG. 4 or in greater numbers may be attached to the cable ends to couple signals into waveguides. The techniques may be combined so that a single package has some radios mounted as shown in FIG. 4 and also one or more flex cables as shown in FIG. 1.

Figure 5:
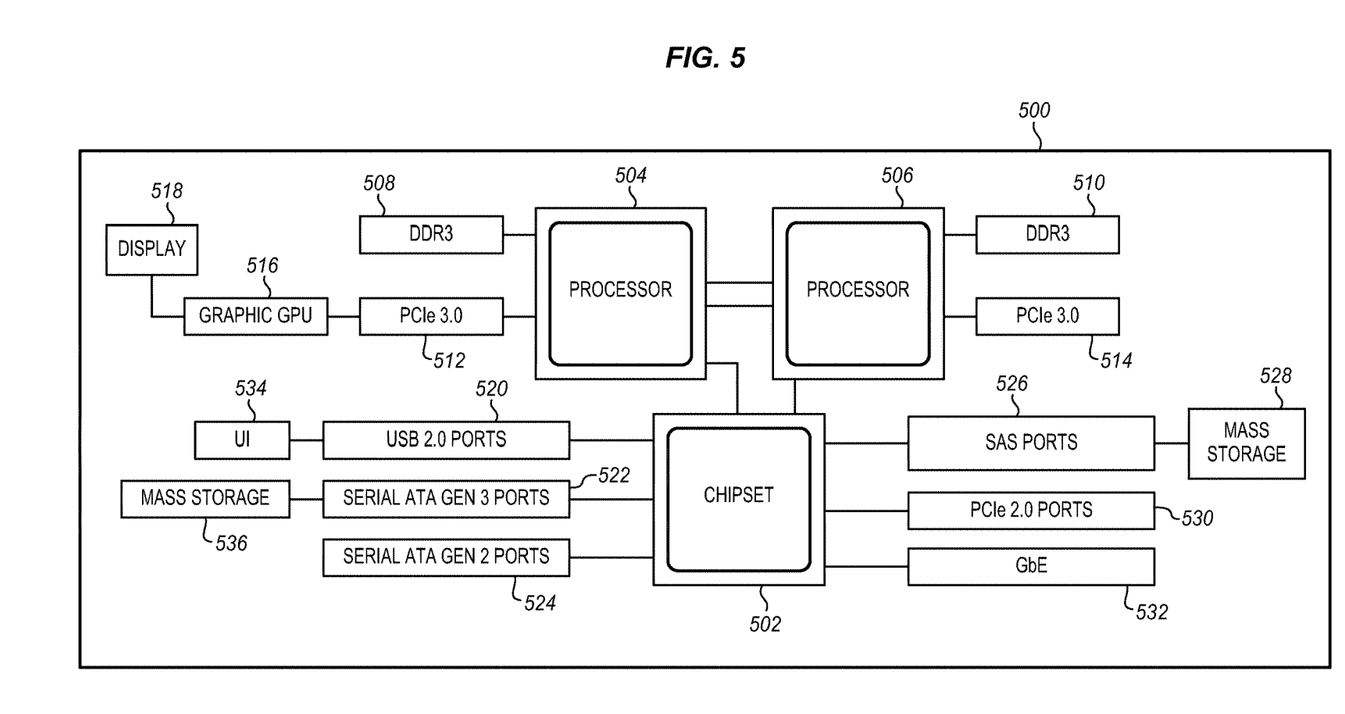
FIG. 5 is a block diagram of a computing system with multiple high speed interfaces according to an embodiment.

FIG. 5 is a block diagram of a computing system 500 with multiple high speed interfaces that may be implemented using the wireless connections as described herein. The computing system may be implemented as a server, microserver, workstation, or other computing device. The system has two processors 504, 506 having multiple processing cores although more processors may be used, depending on the particular implementation. The processors are coupled together through a suitable interconnect such as the wireless interconnect described herein. The processors are each coupled to a respective DRAM (Dynamic Random Access Memory) module 508, 510 using a suitable connection, such as the wireless connection described herein. The processors are also each coupled to a PCI (Peripheral Component Interconnect) interface 512, 514. This connection may also be wired or wireless.

The PCI interfaces allow for connections to a variety of high speed additional components such as graphics processors 516 and other high speed I/O systems for display, storage and I/O. The graphics processor drives a display 518. Alternatively, the graphics processor is core or a die within one or both of the processors. The graphics processor may also be coupled to a different interface through a chipset.

The processors are also both coupled to a chipset 502 which provides a single point of contact for many other interfaces and connections. The connection to the chipset may also be wired or wireless, one or both of the processors may be connected to the chipset, depending on the implementation. As shown, a processor 504 may have a wireless connection to one or more processors 506, memory 508, peripheral components 512, and a chipset 502. These connections may all be wireless as suggested by the multiple radio and antennas of FIG. 4. Alternatively, some of these connections may be wired. The processor may have multiple wireless links to the other processor. Similarly the chipset 502 may have wireless connections to one or more of the processors as well as to the various peripheral interfaces as shown.

The chipset is coupled to USB (Universal Serial Bus) interface 520 which may provide ports for connections to a variety of other devices including a user interface 534. The chipset may be connected to SATA (Serial Advanced Technology Attachment) interfaces 522, 524 which may provide ports for mass storage 536 or other devices. The chipset may be connected to other high speed interfaces such as a SAS (Serial Attached Small computer serial interface) interface 526 with ports for additional mass storage 528, additional PCI interfaces 530 and communications interfaces 532, such as Ethernet, or any other desired wired or wireless interface. The described components are all mounted to one or more boards and cards to provide the described connections.

Figure 6:
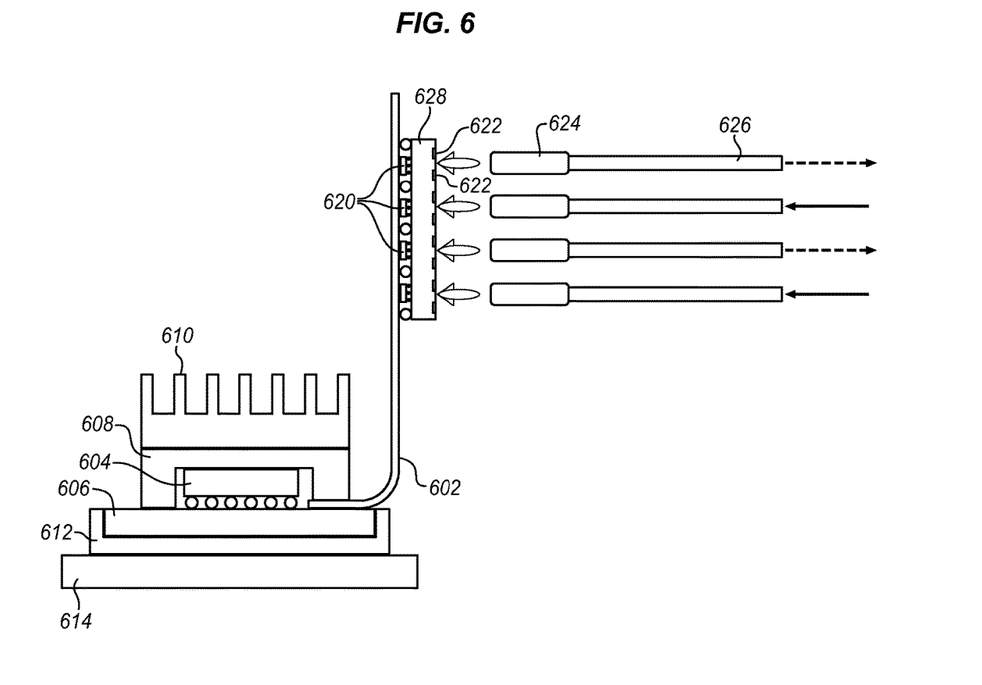
FIG. 6 is a side view diagram of a socketed package with flex cable for wireless communication according to an embodiment.

FIG. 6 is a side view diagram of socketed package with a heat sink and a longer flex cable than in the previous examples. A flexible cable 602 is connected on one end to a die 604, such as a CPU, a SerDes (Serializer/Deserializer), or other signal processing, interface, or storage die. The die is attached to a package substrate 606 or any other suitable carrier to connect the die to external components for data and power. In this example, the die is covered with an integrated heat spreader 608 to draw heat from the die. A larger heat sink 610 or other cooler is thermally coupled to the heat spreader to cool the die. However, other types of packaging and cooling may be used, depending on the particular implementation. The substrate is seated into a socket 612 to hold the die in position and the socket is mounted to a system board 614 to connect the package die to other components.

A wireless interconnect module 620 is mounted on the other end of the flexible cable. This second end of the cable can be attached to a server rack (not shown) to enable intra and inter-rack data transfer. The wireless module may be fabricated on a multilayer package substrate 628 and include several radio transceivers 620. The radio transceivers may be FC (Flip-Chip) assembled or embedded inside the package substrate. Alternatively, each radio die may be separately attached to the cable. Each radio transceiver is connected to a small subset of antennas 622. As shown, the antennas may be a patch, a pad, or a metal plate on the package or on the cable and connected through the package to a respective radio die. More complex antenna types may alternatively be used. Multiple parallel focused beams may be generated by a parallel antenna array. The signal beams are coupled into a bundle of dielectric waveguides 626 through corresponding waveguide coupler 624. Through the waveguides, the signals are transported to the receiving end of another wireless interconnect which may be similar to the one shown. The receiving wireless interconnect may be on the same rack or on a different rack within a server farm.

While this description is in terms of signals from the die to a remote interconnect. Through reciprocity, similar signals may also be received from a remote component through the waveguides and coupled into antennas to be received by the radio dies and conveyed through the cable to the die.

This end to end platform has wireless interconnects 624 on flex cable 602 that connects to low cost plastic waveguides 626. Any suitable flexible substrate may be used for the cable and for the radio package substrate 628. The cable may be made of plastic, metal, or other materials. The cable connects to the CPU die 604 in the same way that an optical or electrical connector would, such as through traces in the package substrate. In this case the wireless interconnect includes a multiple chip package with multiple radio chips 620. Each chip drives an antenna 622 subset to generate a highly directive beam that is coupled by a coupler 624 into a respective dielectric waveguide 626.

Figure 7:
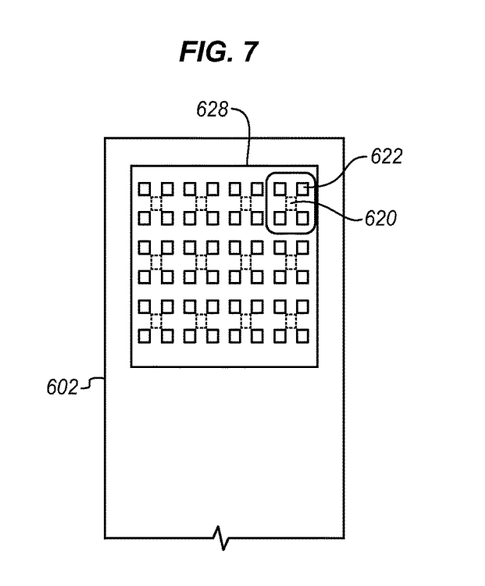
FIG. 7 is a top view diagram of the radio and antenna package of FIG. 6 according to an embodiment.

FIG. 7 is a top view diagram of the multiple radio chip package 628 of FIG. 6. In this embodiment, the package is rectangular and receives electrical signals from the CPU 604 through the cable 602. The package has mm-wave transceivers 620 in small silicon chips that are attached on the back of the package. Sixteen such chips are shown on this package each with four antennas. The particular number and size may be adapted to suit different implementations. The sixteen chips allow for up to 64 different radio channels in 64 different waveguides. Beamforming using a combination of chips and antennas may be used to enable N different channels with $1 \leq N \leq 64$. The radio chips may be mounted on the back side of the package substrate as shown embedded in the package substrate or mounted on the front side. The front side location reduces the space available for antennas.

Figure 8:
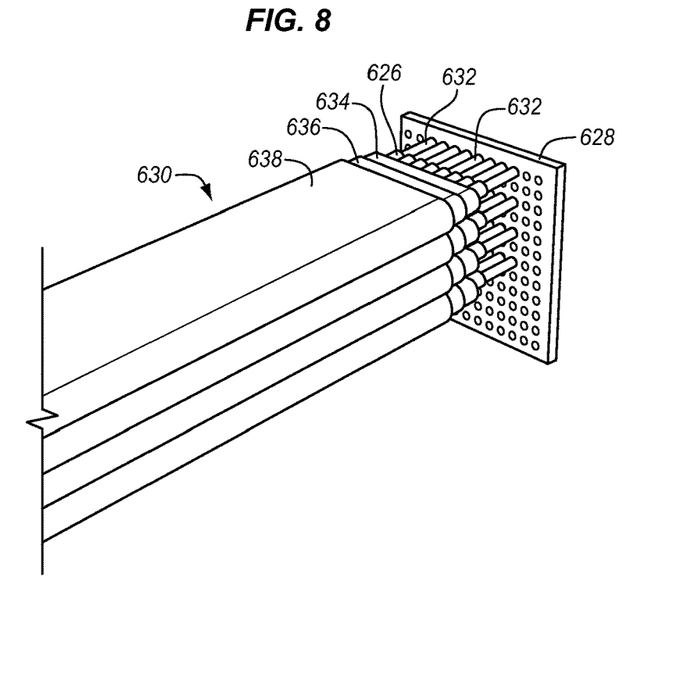
FIG. 8 is an isometric view of the radio and antenna package of FIG. 6 with dielectric waveguides according to an embodiment.

FIG. 8 is an isometric view of the front side of the package 628 of FIG. 7 placed in reference to a bundle 630 of dielectric waveguides. The package has plastic dielectric waveguides or tubes over each antenna that catch the electromagnetic energy from each on-package antenna 622. The tubes may be formed of any of a variety of different plastics, such as polytetrafluorethylene. The tubes connect into each corresponding dielectric waveguides 626 through a transition. The waveguides are wrapped together for ease of handling and stability. As shown the wrap include a first layer of dielectric 634, covered by a second layer of dielectric 636, covered by a layer of metal 638. The bundles are shown as horizontal with one row of waveguides in each bundle, but different configurations may also be used.

The wrapping for the dielectric waveguides may be formed using different conductive and different dielectric materials. The dielectrics may be formed of a variety of different plastics and other materials that have different dielectric constants, loss tangents, and other properties. In some embodiments, the innermost material has a low-k material, the outer material is a high-k material. Other embodiments may be the opposite. In some embodiments, the outer wrapping 638 may be a non-conductive dielectric material or a doped polymer. Alternatively, the other wrapping may be a continuous conductive sheet or small conductive patches on top of a dielectric next layer 636. The conductive patches may be used to provide isolation between the individual waveguide bundles with reduced skin effect losses. The size and spacing between the conductive patches may be sized as fractions of the wavelength of interest The bundles may be arranged so that each bundle connects the CPU to a different external component. Alternatively, all of the bundles may connect to the same component. Such a compact and direct waveguide connection is able to transmit at 6 Gb/s or more with 1 meter long waveguides. Even at 2 meter lengths, the data rate is almost as high. With 64 waveguides, as shown, the data rate over 1 meter may be 384 Gb/s or more. The dielectric bundles may communicate to other components in the same housing or to components in a nearby housing in the same or a nearby equipment rack. The communications are high data rate and low power so that they are suitable for used in microservers and may also be applied to Rack-Scale-Architecture (RSA) as well as ExaScale systems.

Figure 9:
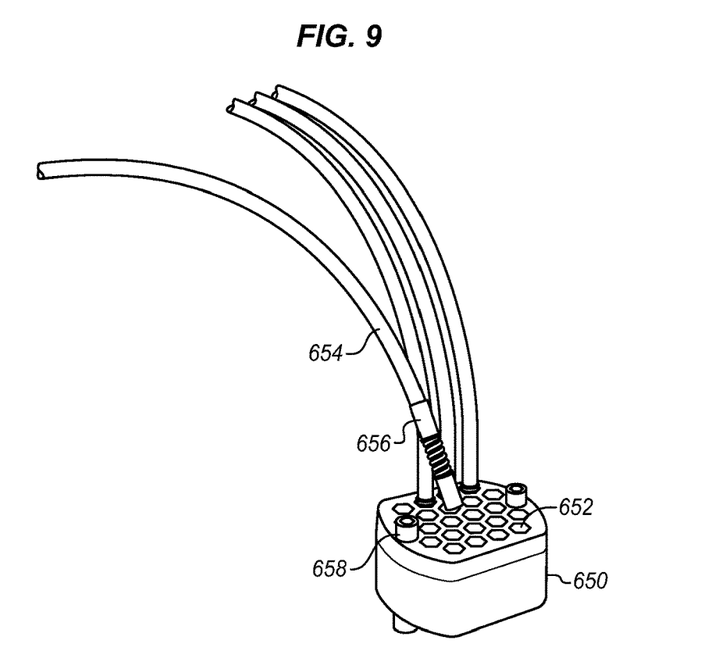
FIG. 9 is an isometric diagram of a waveguide connector according to an embodiment.

FIG. 9 is an isometric diagram that shows a variation on the dielectric waveguide connector and bundle that may be used for a different style of multiple chip radio package and for downstream connectors. A connector head 650 is made of a pliable plastic or other material. Dielectric waveguides 654 are terminated with a coupler 656 that is inserted into holes 652 through the connector. The coupler has ribs to engage the sides of the hole and a waveguide transition to direct radio waves from an antenna into the waveguide. A set of retaining screws 658 may be used to hold the connector to a fixture and in communication with antennas. The connector is roughly hexagonal in shape to carry 20 or more waveguides in a roughly circular pattern. A similar type of connector may be used in the examples of FIGS. 7 and 8 to hold the waveguides together and to press them against the multiple radio chip package 628.

Figure 10:
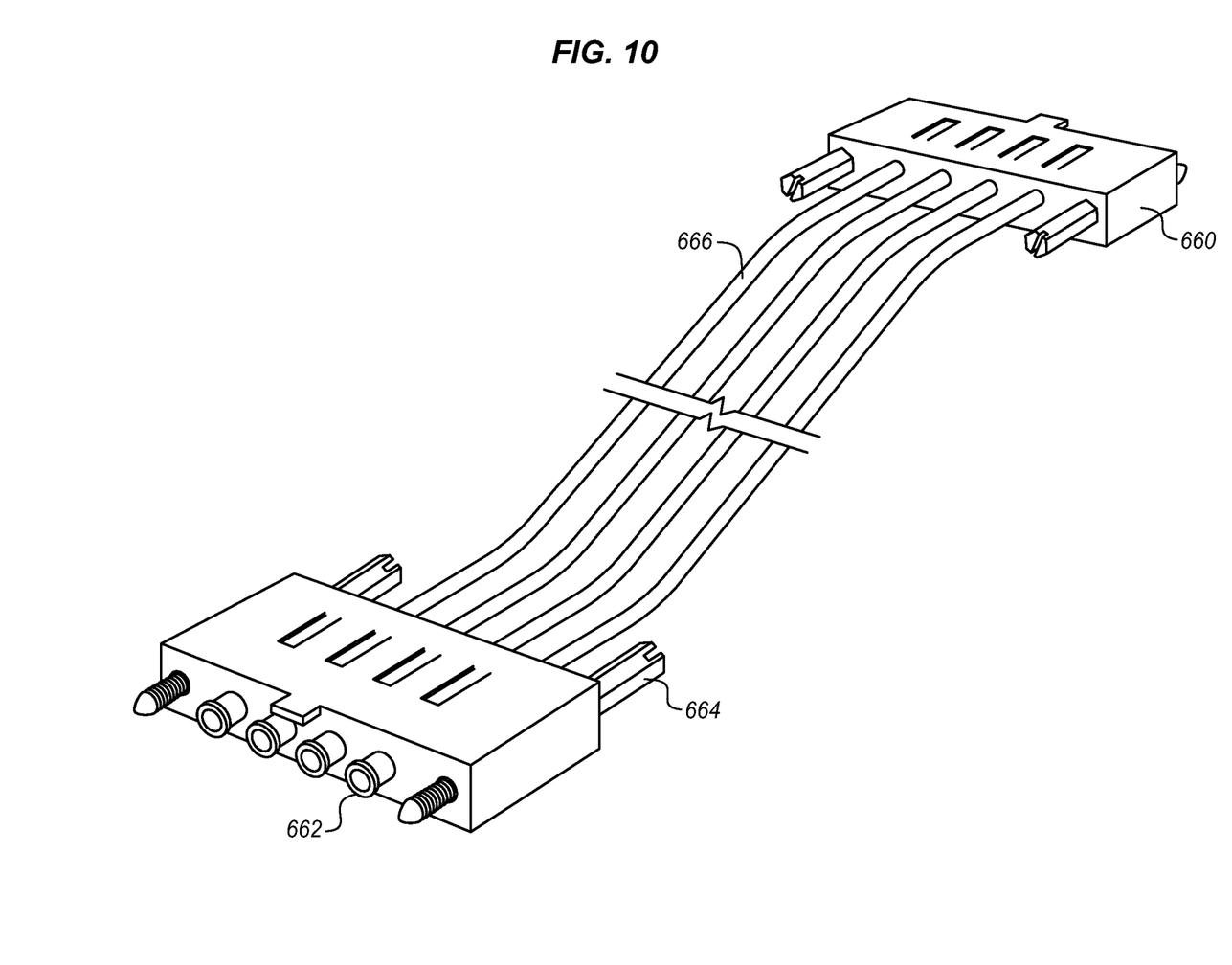
FIG. 10 is an isometric diagram of another waveguide connector according to an embodiment.

FIG. 10 is an isometric diagram that shows another variation on the dielectric waveguide connector and bundle. In this case a linear connector 660 holds a single row of dielectric waveguides 666. These waveguides have couplers 662 at each end to attach the waveguide to the connector and to transition the radio signals from the waveguide to an antenna. Alternatively, such connectors may be used to connect two lengths of waveguide together. Retaining screws 664 on either side of the row of waveguides are mounted to the connector so that the screws may be screwed into a retaining fixture to hold the waveguide in place.

Figure 11:
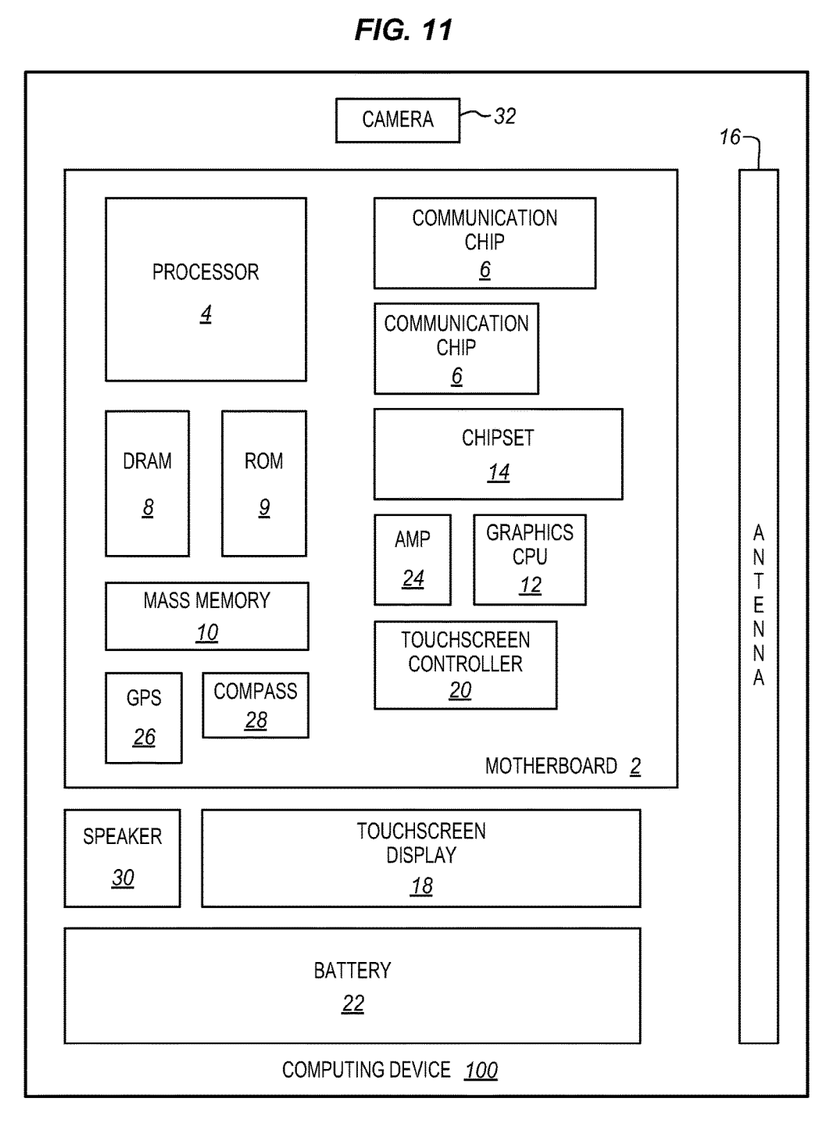
FIG. 11 is a block diagram of a computing device incorporating wireless interfaces according to an embodiment.

FIG. 11 illustrates a computing device 100 in accordance with another implementation. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, any one or more of the components may be adapted to use the wireless connection described herein. The features of the system of FIG. 12 may be adapted to that of FIG. 7 and vice versa. For example, the system of FIG. 12 may carry multiple processors. The system of FIG. 7 may include any one or more of the peripherals shown in FIG. 12. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes an integrated circuit chip, a package substrate to carry the integrated circuit chip, the package substrate having conductive connectors to connect the integrated circuit chip to external components, a cable on the package substrate coupled to the integrated circuit chip at one end, a radio chip on the cable coupled to the cable at the other end, the radio chip to modulate data over a carrier and to transmit the modulated data, and a waveguide transition coupled to a dielectric waveguide to receive the transmitted modulated data from the radio and to couple it into the waveguide, the waveguide to carry the modulated data to an external component.

Further embodiments include an antenna coupled between the radio chip and the waveguide transition to transmit the modulated data to the waveguide transition.

In further embodiments the antenna is formed of metal pads coupled to the cable.

Further embodiments include a radio package on the cable wherein the radio package comprises a substrate, wherein the antenna is formed of a metal plate deposited on the substrate, and wherein the radio chip is attached to the substrate.

In further embodiments the radio package is mounted or partially integrated into the cable.

In further embodiments the radio antenna is on a top surface of the radio package substrate and wherein a waveguide connector is connected to the radio package substrate over the radio antenna.

In further embodiments the radio is formed within layers of the radio package substrate and is connected to the antenna through metal layers of the radio package substrate.

Further embodiments include a waveguide connector, wherein the waveguide transition is terminated by a waveguide coupler that is seated to the waveguide connector and wherein the waveguide connector is attached to the radio package substrate.

In further embodiments the dielectric waveguides comprise hollow dielectric material with a solid dielectric surrounding a hollow center.

Some embodiment pertain to a flex cable having a first end with a plurality of connectors configured to connect to an integrated circuit die and a second end opposite the first end, a plurality of radio dies attached to the cable and coupled to the plurality of connectors through the package, and a plurality of antennas each coupled to a respective radio die to transmit a radio signal.

In further embodiments the radio dies are attached to one side of the cable at the second end and the antennas are attached to the other side of the cable at the second end and coupled to the respective radio die through the cable.

In further embodiments the first end is configured to connect to the die on one side of the cable and to a second die on another side of the cable at the first end.

In further embodiments the first end is configured to connect to the die on one side of the cable and to a package substrate on another side of the cable at the first end.

In further embodiments the plurality of antennas are attached to the package and the antennas are coupled to a respective radio die through the package.

Further embodiments include a package attached to the second end of the cable and wherein the radio dies and the antennas are attached to the package.

Further embodiments include a connector attached to a plurality of dielectric waveguides to connect to the package so that the radio signals from the antennas are coupled into the dielectric connector.

In further embodiments the cable second end is attached to a heat sink of a package of the integrated circuit die.

Some embodiments pertain to a computing system that includes a system board, an integrated circuit die package attached to the circuit board, a flex cable having a first end with a plurality of connectors configured to connect to the integrated circuit die and a second end opposite the first end, a plurality of radio dies attached to the cable and coupled to the plurality of connectors through the package, a plurality of antennas each coupled to a respective radio die to transmit a radio signal, and a plurality of dielectric waveguides coupled to the antennas to carry the radio signals to an external component.

Further embodiments include a package attached to the second end of the cable and wherein the radio dies and the antennas are attached to the package.

In further embodiments the radio is formed within layers of the radio package substrate and is connected to the antenna through metal layers of the radio package substrate.

The invention claimed is:

1. An apparatus comprising:
   an integrated circuit chip;
   a package substrate to carry the integrated circuit chip, the package substrate having conductive connectors to connect the integrated circuit chip to external components;
   a cable on the package substrate coupled to the integrated circuit chip at one end;
   a radio chip on the cable coupled to the cable at the other end, the radio chip to modulate data over a carrier and to transmit the modulated data; and
   a waveguide transition coupled to a dielectric waveguide to receive the transmitted modulated data from the radio chip and to couple it into the waveguide, the waveguide to carry the modulated data to an external component.

2. The apparatus of claim 1, further comprising an antenna coupled between the radio chip and the waveguide transition to transmit the modulated data to the waveguide transition.

3. The apparatus of claim 2, wherein the antenna is formed of metal pads coupled to the cable.

4. The apparatus of claim 2, further comprising a radio package on the cable wherein the radio package comprises a substrate, wherein the antenna is formed of a metal plate deposited on the substrate, and wherein the radio chip is attached to the substrate.

5. The apparatus of claim 4, wherein the radio package is mounted or partially integrated into the cable.

6. The apparatus of claim 1, wherein the radio antenna is on a top surface of the radio package substrate and wherein a waveguide connector is connected to the radio package substrate over the radio antenna.

7. The apparatus of claim 1, wherein the radio is formed within layers of the radio package substrate and is connected to the antenna through metal layers of the radio package substrate.

8. The apparatus of claim 1, further comprising a waveguide connector, wherein the waveguide transition is terminated by a waveguide coupler that is seated to the waveguide connector and wherein the waveguide connector is attached to the radio package substrate.

9. The apparatus of claim 1, wherein the dielectric waveguides comprise hollow dielectric material with a solid dielectric surrounding a hollow center.

10. An apparatus comprising:
    a flex cable having a first end with a plurality of connectors configured to couple to an integrated circuit die and a second end opposite the first end;
    a plurality of radio dies attached to the second end of the flex cable and coupled to the plurality of connectors through the flex cable; and
    a plurality of antennas each coupled to a respective radio die to transmit a radio signal.

11. The apparatus of claim 10, wherein the radio dies are attached to one side of the cable at the second end and the antennas are attached to the other side of the cable at the second end and coupled to the respective radio die through the cable.

12. The apparatus of claim 10, wherein the first end is configured to connect to the die on one side of the cable and to a second die on another side of the cable at the first end.

13. The apparatus of claim 10, wherein the first end is configured to connect to the die on one side of the cable and to a package substrate on another side of the cable at the first end.

14. The apparatus of claim 10, wherein the plurality of antennas are attached to a package and the antennas are coupled to a respective radio die through the package.

15. The apparatus of claim 10, further comprising a package attached to the second end of the cable and wherein the radio dies and the antennas are attached to the package.

16. The apparatus of claim 15, further comprising a connector attached to a plurality of dielectric waveguides to connect to the package so that the radio signals from the antennas are coupled into the dielectric connector.

17. The apparatus of claim 10, wherein the cable second end is attached to a heat sink of a package of the integrated circuit die.

18. A computing system comprising:
    a system board; an integrated circuit die package attached to the circuit board;
    a flex cable having a first end with a plurality of connectors configured to couple to the integrated circuit die and a second end opposite the first end;
    a plurality of radio dies attached to the second end of the flex cable and coupled to the plurality of connectors through the flex cable;
    a plurality of antennas each coupled to a respective radio die to transmit a radio signal; and
    a plurality of dielectric waveguides coupled to the antennas to carry the radio signals to an external component.

19. The computing system of claim 18, further comprising a package attached to the second end of the cable and wherein the radio dies and the antennas are attached to the package.

20. The computing system of claim 19, wherein the radio is formed within layers of the radio package substrate and is connected to the antenna through metal layers of the radio package substrate.

* * * * *